United States Patent

Chu et al.

[11] Patent Number: 5,841,686
[45] Date of Patent: Nov. 24, 1998

[54] DUAL-BANK MEMORY MODULE WITH SHARED CAPACITORS AND R-C ELEMENTS INTEGRATED INTO THE MODULE SUBSTRATE

[75] Inventors: Tzu-Yih Chu, San Jose; Abraham C. Ma, Union City, both of Calif.

[73] Assignee: MA Laboratories, Inc.

[21] Appl. No.: 755,546

[22] Filed: Nov. 22, 1996

[51] Int. Cl.[6] .................................................. G11C 5/02
[52] U.S. Cl. ............................... 365/51; 365/52; 365/54; 365/226; 365/228; 365/193; 365/63
[58] Field of Search .................................. 365/51, 52, 54, 365/226, 228, 193, 63

[56] References Cited

U.S. PATENT DOCUMENTS

| Re. 35,064 | 10/1995 | Hernandez | 361/763 |
|---|---|---|---|
| 4,727,513 | 2/1988 | Clayton | 365/52 |
| 4,870,746 | 10/1989 | Klaser | 29/620 |
| 4,878,155 | 10/1989 | Conley | 361/401 |
| 4,882,700 | 11/1989 | Mauritz et al. | 365/51 |
| 5,038,132 | 8/1991 | Lindblom et al. | 338/307 |
| 5,161,086 | 11/1992 | Howard et al. | 361/321 |
| 5,172,304 | 12/1992 | Ozawa et al. | 361/401 |
| 5,257,233 | 10/1993 | Schaefer | 365/227 |
| 5,261,153 | 11/1993 | Lucas | 29/830 |
| 5,270,493 | 12/1993 | Inoue et al. | 174/261 |
| 5,307,309 | 4/1994 | Protigal et al. | 365/63 |
| 5,329,696 | 7/1994 | Morita et al. | 29/841 |
| 5,347,258 | 9/1994 | Howard et al. | 338/333 |
| 5,377,079 | 12/1994 | Morita et al. | 361/752 |
| 5,384,434 | 1/1995 | Mandai et al. | 174/258 |
| 5,400,221 | 3/1995 | Kawaguchi | 361/771 |
| 5,428,885 | 7/1995 | Takaya et al. | 29/25.42 |
| 5,469,324 | 11/1995 | Henderson et al. | 361/301.2 |
| 5,504,373 | 4/1996 | Oh et al. | 257/734 |
| 5,654,929 | 8/1997 | Mote, Jr. | 365/222 |

OTHER PUBLICATIONS

Internal Capacitors & Resistors for Multilayer Ceramic Modules, Lussow, IBM Technical Disclosure Bulletin, Feb. 1978, p. 3436–3437.
Packaging of Integrated Circuits, McIntosh et al., IBM Technical Disclosure Bulletin, Nov. 1972, pp. 1977–1980.
A New Family of Microelectronic Packages for Avionics, Settle, Solid State Technology Jun. 1978, pp. 54–58.
High Denisty Discrete Wiring Offers A Solution to Chip Carrier Design, Lassen et al., Electronic Packaging and Production, Jan. 1983, pp. 218–221.

Primary Examiner—David C. Nelms
Assistant Examiner—Andrew Q. Tran
Attorney, Agent, or Firm—Staurt T. Auvinen

[57] ABSTRACT

A memory module has DRAM chips mounted on both a front and a back surface but decoupling capacitors mounted on only the front surface. Each decoupling capacitor is for suppressing current spikes from a pair of DRAM chips. The pair of DRAM chips includes a first DRAM chip on the same surface as the capacitor and a second DRAM chip opposite the first DRAM chip on the back surface of the module. The first DRAM chip belongs to a first bank while the second DRAM chip belongs to a second bank. Two RAS signals are for controlling access to the two banks. Since only one bank is accessed at any time, and access causes current spikes, only one bank and only one DRAM chip in the pair of DRAM chips creates a current spike at any time. Thus a capacitor can be shared between the two DRAM chips in the pair. The shared capacitor can be mounted next to or under one of the DRAM chips, or formed within the multi-layer substrate itself. Having capacitors on only one of the surfaces reduces the number of placement sequences required, reducing manufacturing cost.

20 Claims, 3 Drawing Sheets

FRONT SIDE

BACK SIDE

FIG. 1 FRONT SIDE PRIOR ART

BACK SIDE

FIG. 2 FRONT SIDE

BACK SIDE

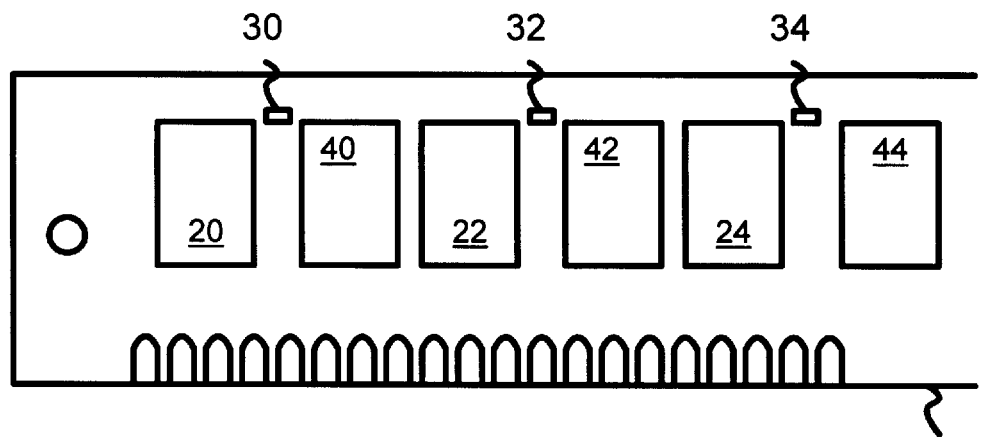
FIG. 5
FIG. 6
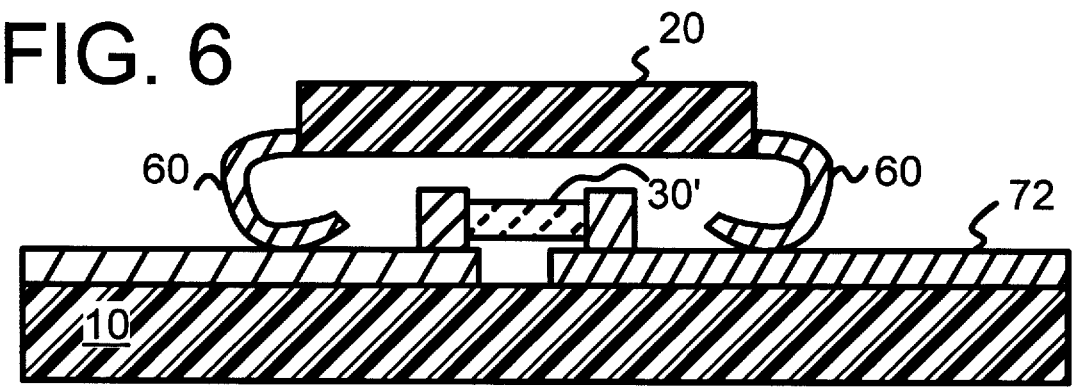
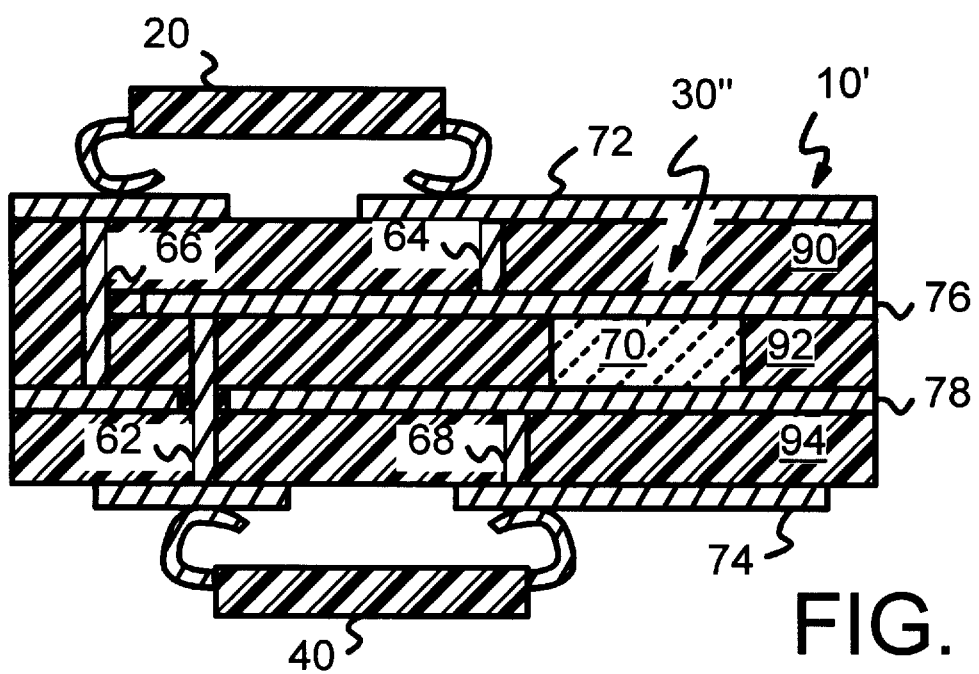
FIG. 7

DUAL-BANK MEMORY MODULE WITH SHARED CAPACITORS AND R-C ELEMENTS INTEGRATED INTO THE MODULE SUBSTRATE

BACKGROUND OF THE INVENTION

1. Field of the Invention

This invention relates to memory modules, and more particularly for modules and production methods to reduce the cost of DRAM memory modules.

2. Description of the Related Art

Memory modules have gained enormous popularity in recent years. Most personal computers (PC's) are shipped with sockets for memory modules so the PC user can later add additional modules, increasing the memory capacity of the PC. High-volume production and competition have driven module costs down dramatically, benefiting the PC buyer.

Memory modules are made in many different sizes and capacities, with the older 30-pin modules being replaced by 72-pin and 168-pin modules. The "pins" were originally pins extending from the module's edge, but now most modules are leadless, having metal contact pads or leads. The modules are small in size, being about 3 or 4 inches long and ¾-inch high. The modules contain a small printed-circuit board substrate, typically a multi-layer board with alternating laminated layers of fiberglass insulation and foil or metal interconnect layers. Surface mounted components are soldered onto one or both surfaces of the substrate. Dynamic-RAM integrated circuits (IC's) or chips are commonly packaged in inexpensive surface-mount packages such as small-outline J-leaded (SOJ) packages, PLCC's, or small-outline (SO) packages.

The DRAM chips draw significant amounts of current when RAS (row address strobe) and CAS (column address strobe) are asserted during accessing of the memory and refresh. Asserting RAS or CAS causes current spikes which could upset the power and ground potentials on the memory module. Thus capacitors are often mounted on the substrate near each DRAM chip. The capacitors are connected between power and ground as close as possible to the power and ground pins of each DRAM package. Typically the number of capacitors equals the number of DRAM chips mounted on the module. See the background discussion by U.S. Pat. No. 5,307,309 for "Memory Module Having On-Chip Surge Capacitors" by Protigal et al.

FIG. 1 is a diagram of a prior-art double-sided memory module. The memory module contains a substrate 10, with surface-mounted DRAM chips 12 mounted to the front surface or side of substrate 10, while more DRAM chips 18 are mounted to the back side or surface of substrate 10. Metal contact pads 8 are positioned along the bottom edge of the module on both front and back surfaces. Metal contact pads 8 mate with pads on a module socket to electrically connect the module to a PC's motherboard. Holes 6 and notch 4 are used to ensure that the module is correctly positioned in the socket.

Capacitors 14 are mounted on the front surface of the module near each of DRAM chips 12, while additional capacitors 16 are mounted near each DRAM chip 18 on the back surface of the module. Thus capacitors are mounted on both the front and back surfaces of the module when DRAM chips are also mounted on both surfaces. These capacitors are surface-mount passive components.

Manufacture Requires Separate Steps for Each Surface

Manufacture of these memory modules involves many steps. The substrate's interconnect layers are patterned and via holes drilled. The larger surface mount DRAM packages are wave-soldered or placed and solder-reflowed to one surface, then DRAMs are soldered to the back surface. Smaller surface-mount components such as capacitors and resistors are also placed on each surface separately from the larger DRAMs, often before the DRAMs are attached.

Components are attached to only one surface of the substrate during any soldering step. Using modern equipment, each attachment of components requires the steps of:

1. Applying a mix of solder and solder paste to only the metal areas which are being attached to components in the current soldering sequence.
2. Placing the desired components onto the solder and solder paste mixtures over the metal attach areas of the substrate.
3. Heating the entire substrate to heat the solder mixture to re-flow the solder and form a solid bond between the metal leads of the desired components and the metal attach areas of the substrate.

This sequence is then repeated for another surface of the substrate, or another set of desired components.

Since passive components such as capacitors and resistors must be placed onto the solder paste separately from the larger DRAM chips, two placement sequences are needed for each surface with both DRAM chips and passive components. Thus a two-sided memory module requires four sequences of placing components. Moving the nozzle of the high-speed manufacturing machines to place passive components at the various locations requires time on the expensive machine.

What is desired is to reduce the manufacturing cost of a memory module. It is desired to reduce the number of sequences of steps required to mount the components. It is further desired to reduce costs of memory modules with multiple-banks of DRAMs. It is also desired to use passive components embedded into the substrate layers rather than surface-mounted passive components.

SUMMARY OF THE INVENTION

A dual-bank memory module with shared capacitors has a substrate with wiring traces for conducting signals. The substrate also has power-supply traces and ground traces for connection to a power supply and a ground. A plurality of leads along a bottom edge of the substrate includes a power-supply lead and a ground lead and control leads and data leads. The plurality of leads electrically connect the dual-bank memory module to a system.

Pairs of DRAM chips each have a first DRAM chip from a first bank and a second DRAM chip from a second bank. Each pair of DRAM chips shares a capacitor coupled between power-supply and ground pins of the first and second DRAM chips. Thus each pair of DRAM chips share a capacitor.

In further aspects of the invention all capacitors are mounted on a first surface of the substrate and no capacitors are mounted on a second surface of the substrate. The second surface is opposite the first surface. The number of capacitors is substantially half of a number of DRAM chips. Each pair of DRAM chips includes the first DRAM chip mounted on the first surface of the substrate and the second DRAM chip mounted on the second surface of the substrate. Thus the DRAM chips in a pair are mounted on opposite surfaces of the substrate.

In further aspects the first DRAM chip is mounted opposite the second DRAM chip with an overlapping portion of the second DRAM chip on the second surface. In another aspect, the first DRAM chip is mounted substantially opposite the second DRAM chip in each pair of DRAM chips.

In other aspects the control leads include a first RAS signal and a second RAS signal. The first RAS signal is connected to all DRAM chips in the first bank but is not connected to any DRAM chips in the second bank, while the second RAS signal is connected to all DRAM chips in the second bank and is not connected to any DRAM chips in the first bank. Thus the first bank and the second bank of DRAMs are separately controlled.

In other aspects the first DRAM chip and the second DRAM chip in the pair of DRAM chips both are coupled to a same data bit signal in the data leads. The same data bit signal is not connected to other DRAM chips in the module. Thus each pair of DRAM chips is coupled to a unique data bit in the data leads.

BRIEF DESCRIPTION OF THE DRAWINGS

FIG. 5 is a diagram of a module with pairs of adjacent DRAM chips that share a capacitor.

FIG. 6 is a cross-sectional diagram of a DRAM chip with a decoupling capacitor mounted underneath the DRAM chip.

FIG. 7 is a cross-sectional diagram of a module where the decoupling capacitors are an integral part of the substrate material itself.

DETAILED DESCRIPTION

Figure 1A:
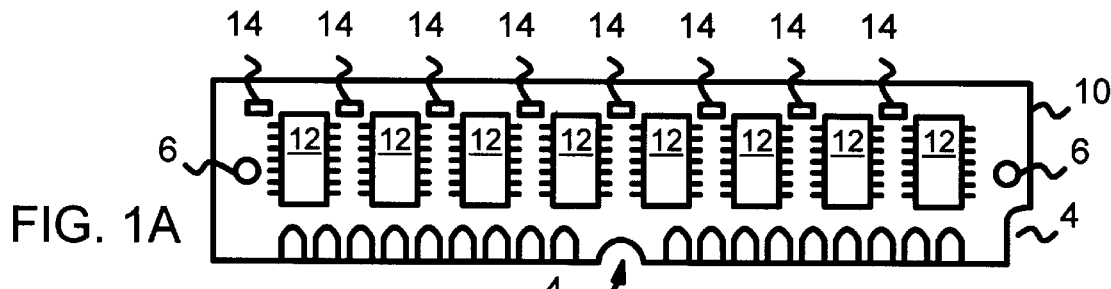
FIG. 1 is a diagram of a prior-art double-sided memory module.
Figure 1B:
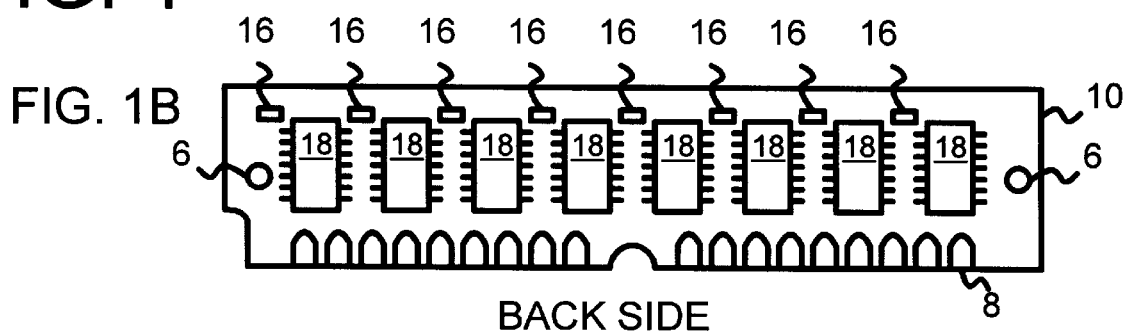

The present invention relates to an improvement in the manufacture of memory modules. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventors have realized that significant cost savings results when one of the placement sequences is eliminated. Separate placement sequences are needed for the DRAM chips and for the smaller capacitors. Components can be placed on only one surface during any one soldering sequence. The number of placement sequences is determined by the grouping of components onto the surfaces of the module's substrate. Changing the grouping of components can reduce the number of placement sequences and thus lower manufacturing cost.

Of course, with a module having only one surface, only two placement sequences are needed. Components cannot be re-grouped on the only surface to reduce the number of placement sequences without eliminating the capacitors or the DRAM chips altogether. The prior art double-sided module required four placement sequences:
1. Placing capacitors on the front surface.
2. Placing DRAM chips on the front surface.
3. Placing capacitors on the back surface.
4. Placing DRAM chips on the back surface.

Components are thus grouped into four groups for the prior-art module:
1. Capacitors on the front surface.
2. DRAM chips on the front surface.
3. Capacitors on the back surface.
4. DRAM chips on the back surface.

The inventors have realized that it is not essential for capacitors to be soldered to both the front and back surfaces of the module. Thus the inventors group components into only three groups:
1. DRAM chips on the front surface.
2. Capacitors on the front surface.
3. DRAM chips on the back surface.

Only three simplified placement sequences are needed:
1. Place capacitors onto the front surface.
2. Place DRAM chips onto the front surface.
3. Place DRAM chips onto the back surface.

The inventors have found that about one second per module can be saved by placing all capacitors on one surface rather than one two surfaces. This is a significant savings due to the high cost of modern manufacturing equipment which operates at a very high speed.

The capacitors soldered to the back surface could be placed and soldered to the front surface instead of the back surface to keep the number of capacitors constant. Alternately, the capacitance value of the capacitors on the front surface can be doubled to provide the same amount of total decoupling capacitance on the module. Another embodiment simply deletes the capacitors on the back surface without enlarging the capacitance value of the front-surface capacitors.

The module's substrate must provide sufficient vias or through-holes to connect the power-supply pins of the DRAM chips and capacitors on the front surface to the power-supply pins of the DRAM chips on the back surface. Likewise, vias are needed to connect ground pins of the DRAM chips and capacitors mounted on the front surface with the ground pins of the DRAM chips on the back surface. If such vias were not provided, then the back-surface DRAM chips would not have the capacitors near enough to their power-supply and ground pins and insufficient decoupling would result. However, multi-layer substrates typically have a separate ground layer or plane and another power layer. These layers are usually embedded within the substrates laminated layers and not one of the two surface layers. Thus many vias are provided to both surfaces from the power and ground layers inside the substrate.

A capacitor mounted on the front surface is only the thickness of the substrate away from the back surface. The small thickness (less than ⅛-th of an inch) of the substrate allows a capacitor on the front surface to still be sufficiently close to a DRAM mounted on the back surface to provide effective de-coupling. Thus capacitors for de-coupling DRAM chips on the back surface can be mounted on the front surface. A single placement sequence can attach all capacitors to the front surface of the module, yet these capacitors can provide de-coupling for DRAMs mounted on both surfaces.

Figure 2A:
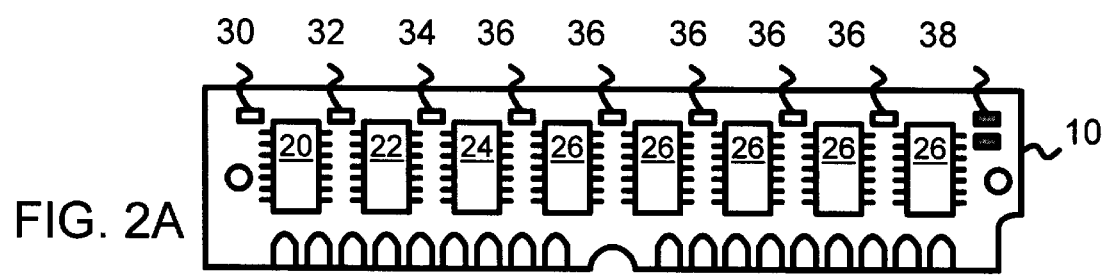
FIG. 2 is a diagram of a double-sided memory module with all the capacitors mounted on the front surface.
Figure 2B:
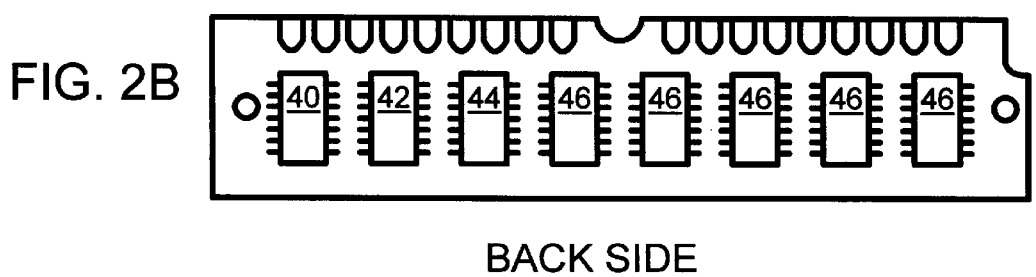

FIG. 2 is a diagram of a double-sided memory module with all the capacitors mounted on the front surface. DRAM chips 20, 22, 24, 26 are surface-mounted on the front surface while DRAM chips 40, 42, 44, 46 are surface-mounted on the back surface of the module. Capacitors 30, 32, 34, 36 are mounted to the front surface. Other passive components are also mounted to the front surface, such as resistors 38 used to dampen ringing caused by high-drive signals. No capacitors are mounted to the back surface of the module, so only one placement sequence is needed to mount components to the back surface. Two placement sequences are needed for mounting components to the front surface. Thus a total of three placement sequences are needed.

Capacitor 30 is in close proximity to DRAM chip 20 on the front surface and to DRAM chip 40 on the back surface. Thus capacitor 3—provides decoupling of current spikes from either of DRAM chips 20, 40. Capacitor 32 is closest to DRAM chips 22, 42 on the front and back surfaces respectively, so capacitor 32 provides decoupling to DRAM chips 22, 42. Likewise capacitors 34, 36 each provide coupling to a closest DRAM chip 24, 26 on the front surface and another DRAM chip 44, 46 on the back surface.

Capacitors are often mounted near the upper left of a DRAM chip, since this is where the power-supply pin often is. The ground pin is typically on the lower right corner of the DRAM chip, so the coupling capacitor is separated from the ground pin by the diagonal length of the DRAM chip. Other DRAM chips place the ground pin near the middle of the chip, reducing the diagonal length to the capacitor even more. This diagonal length is greater than the substrate's thickness, yet not so long than decoupling is defeated. These capacitors typically have a value of 0.1 $\mu$F.

Figure 3:
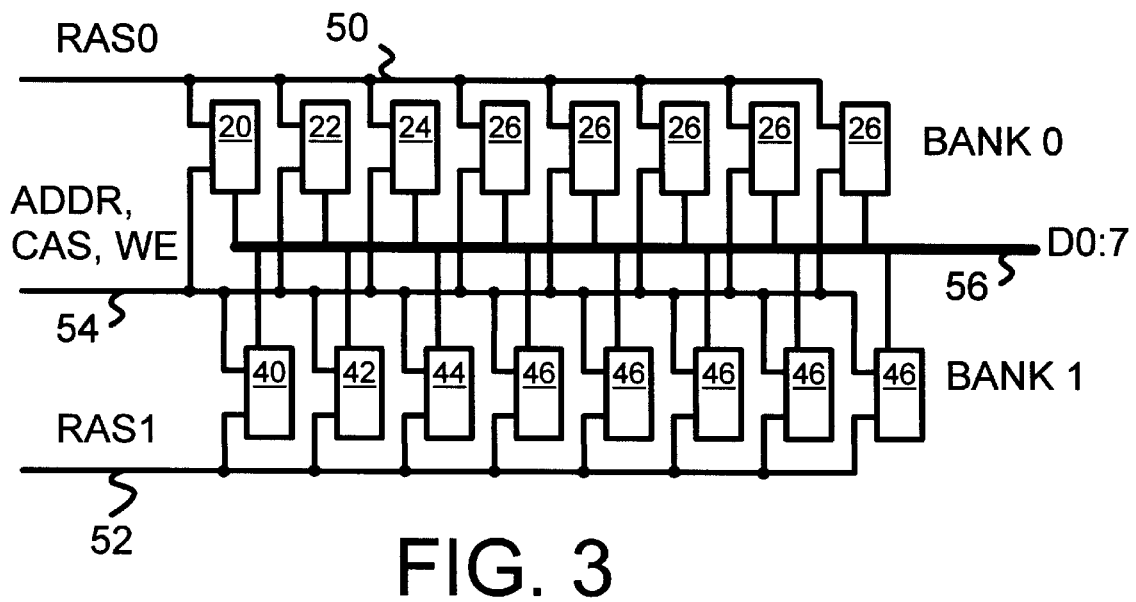
FIG. 3 is a schematic diagram of a dual-bank memory module.

Multiple Banks on a Module—FIG. 3

FIG. 3 is a schematic diagram of a dual-bank memory module. The first bank, "BANK 0", has eight DRAM chips 20, 22, 24, 26, each connected to a single data bit (D0 through D7) of data bus 56. The second bank, "BANK 1", also eight DRAM chips 40, 42, 44, 46, each connected to a single data bit (D0 through D7) of data bus 56. Thus each data bit of the eight-bit data bus 56 is connected to two DRAM chips. For example, data bit D0 is connected to the data I/O pin of DRAM chip 20 of bank 0 and DRAM chip 40 of bank 1.

Control bus 54 includes CAS, write-enable WE, and address signals to all DRAM chips in both banks. The address signals are multiplexed for DRAMs, where the row address is applied to control bus 54 when RAS is asserted, while the column address is applied to control bus 54 when CAS is asserted. The module may include a small decoder (not shown) which uses one address signal (which is not sent over control bus 54) to activate either RAS0 50 or RAS1 52 when RAS is asserted to the module. Alternately, the PC motherboard or system may supply two separate RAS signals RAS0 50 and RAS1 52 to the module through the module's connecting lead pads.

RAS0 50 is asserted when bank 0 is accessed, while RAS1 52 is asserted when bank 1 is accessed. Both RAS0 and RAS1 are not asserted at the same time. RAS0 50 causes all eight DRAM chips 20, 22, 24, 26 of bank 0 to a drive data bit to data bus 56 on a read when WE is inactive, or to write in the data on data bus 56 when WE is active during a write cycle. RAS1 52 performs the similar function for DRAM chips 40, 42, 44, 46 of bank 1.

Multiple Banks Can Share Capacitors

The inventors have also realized that modules with two or more banks of DRAMs can share capacitors since only one bank is being accessed at any one time. When the first bank is being read, the second bank is idle. When the second bank is read, the first bank is idle. Only the first bank of DRAM is generating current spikes which require decoupling. The second bank requires no decoupling while the first bank is being read. Both banks cannot be read simultaneously since they share a data bus and a bus conflict results if both banks were to drive the data bus at the same instant.

The module of FIG. 2 can be used where DRAM chips 20, 22, 24, 26 mounted on the front surface are in one bank, while DRAM chips 40, 42, 44, 46 mounted on the back surface are in a second bank. Thus either the front-surface DRAM chips or the back-surface DRAM chips are being accessed at any given time. Only one set of capacitors is needed since only one bank can be accessed at any time. Capacitors 30, 32, 34, 36 mounted on the front surface provide de-coupling for front-surface DRAMs when RAS 0 and bank 0 is accessed, while the same capacitors provide de-coupling for back-surface DRAMs when RAS 1 and bank 1 is accessed.

Figure 4:
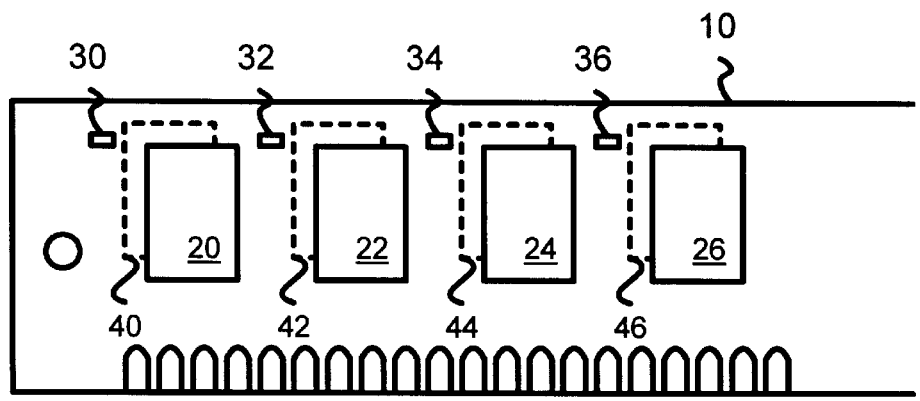
FIG. 4 is a close-up diagram of a portion of a module having pairs of opposing DRAM chips from two banks sharing a capacitor.

Opposing DRAM Chips Share Capacitor—FIG. 4

FIG. 4 is a close-up diagram of a portion of a module having pairs of opposing DRAM chips from two banks sharing a capacitor. DRAM chips 20, 22, 24, 26 are mounted on the front surface of substrate 10 while DRAM chips 40, 42, 44, 46 are mounted on the opposing surface, the back side of substrate 10.

The first bank includes DRAM chips 20, 22, 24, 26 mounted on the front surface, while the second bank includes DRAM chips 40, 42, 44, 46 mounted on the back surface. The first bank is accessed when RAS0 is asserted, while the second bank is asserted when RAS1 is asserted. RAS0 can be routed to DRAM chips 20, 22, 24, 26 using wiring traces on the front surface, while RAS1 can be routed to DRAM chips 40, 42, 44, 46 using wiring traces on the back surface. While some cross-under routing may be needed for RAS0 or RAS1, mounting all DRAM chips from one bank on the same surface simplifies RAS interconnect routing. RAS delay, a critical parameter, is thus kept small. Capacitors 30, 32, 34, 36 are all mounted on the front surface of substrate 10. As can be seen in FIG. 4, capacitor 30 is in close proximity to DRAM chip 20 on the same front surface of substrate 10. Capacitor 30 is also in close proximity to DRAM chip 40 mounted on the back surface since DRAM chip 40 is mounted opposite DRAM chip 20. Two vias or through holes are needed to connect the power-supply and ground pins of DRAM chip 40 to capacitor 30, but multi-layer boards often already have many vias to connect an internal ground or power-supply plane to the surface pins. Thus the frequent interconnect of power and ground through substrate 10 is already present on many modules.

FIG. 4 shows that DRAM chip 40 is mounted approximately opposite of DRAM chip 20. DRAM chips 20, 40 do not have to be mounted exactly opposite each other. As shown, there is an overlap of the two DRAM chips. A smaller overlap is possible, and even no overlap is contemplated on some layouts, although the overlap is preferred as capacitor 30 can then be closer to both DRAM chip's power and ground pins.

Other pairs of opposing DRAM chips share a capacitor. DRAM chips 22, 42 share capacitor 32, while DRAM chips 24, 44 share capacitor 34. In the preferred embodiment, the two DRAM chips in the opposing pair both drive the same data bit, but at different times since the two chips are in two different banks, controlled by two different RAS signals. The two chips in the opposing pair could drive different data bits, although the wiring length of the data-bit traces then increases, increasing delay slightly.

Single-Sided Module with Shared Capacitors—FIG. 5

FIG. 5 is a diagram of a module with pairs of adjacent DRAM chips that share a capacitor. When a single-sided module is desired, pairs of DRAM chips can still share a capacitor. DRAM chip 20 and DRAM chip 40 are mounted adjacent to each other on the same side of the module. Capacitor 30 is ideally mounted between the adjacent DRAM chips 20, 40 to provide decoupling for them. DRAM chip 20 is from the first bank and is controlled by RAS0O, while the other DRAM chip in the pair of adjacent chips, DRAM chip 40, is in the second bank and is controlled by the separate RAS1.

Thus both of the DRAM chips in the adjacent pair are mounted on the same surface of substrate 10. Other adjacent pairs include DRAM chips 22, 42 sharing capacitor 32, and DRAM chips 24, 44 sharing capacitor 34. A single-sided module may be constructed by placing both banks on the same surface, but arranging the DRAMs into adjacent pairs of DRAM chips from the two banks so that a single capacitor can be shared.

A double-sided module could be constructed using adjacent pairs shown in FIG. 5. For example, the capacitors 30, 32, 34 could all be mounted on the back surface while all DRAM chips are mounted on the front surface. Another alternative is to mount DRAM chips on both surfaces in adjacent pairs, but mount capacitors only on one surface. The shared capacitors are mounted on the front surface even for adjacent pairs of DRAM chips mounted on the back surface.

A four-bank, double-sided module could be constructed with two adjacent DRAM chips on the front surface for the first two banks, and two more DRAM chips on the back surface for the third and fourth banks. A single capacitor can be shared by four the DRAM chips, since each DRAM chips is part of a different bank. Only one of the four DRAM chips is active at any one time. Thus a single capacitor can be shared among an adjacent pair of a pair of opposing DRAM chips, four DRAM chips in all.

Adjacent pairs are less desirable than opposing pairs, since the average distance from the shared capacitor to the power-supply and ground pins of the two DRAM chips is usually larger for adjacent pairs than for opposing pairs.

Capacitors Mounted Under DRAM Chips—FIG. 6

FIG. 6 is a cross-sectional diagram of a DRAM chip with a decoupling capacitor mounted underneath the DRAM chip. The examples have shown surface-mounted capacitors which are mounted adjacent to DRAM chips. Some types of DRAM packages have sufficient clearance underneath between the bottom the of plastic package and the surface of the module's substrate. SOJ DRAMs typically have enough clearance to mount a capacitor underneath the DRAM chip. Mounting capacitors under the DRAM chips saves area on the substrate and allows the capacitor to be even closer to the power-supply and ground pins of the DRAM chip being decoupled, which is typically the DRAM chip above the capacitor.

DRAM chip 20 has pins which are J-leads 60. J-leads 60 are soldered to metal areas of bonding on top-metal layer 72 on the surface of substrate 10 to make electrical connection. Capacitor 30' is also soldered to metal interconnect areas on the top surface of substrate 10 to make electrical connection. Two separate placement sequences are typically needed to mount capacitor 30' under DRAM chip 20.

Since J-leads 60 have a relatively high profile while surface-mount capacitor 30' has a lower profile, capacitor 30' may be mounted under DRAM chip 20. Thus the capacitors shown in earlier Figures and examples could be mounted directly under one of the DRAM chips rather than next to the DRAM chip.

Capacitor Inside Multi-Layer Substrate—FIG. 7

FIG. 7 is a cross-sectional diagram of a module where the decoupling capacitors are an integral part of the substrate material itself. Substrate 10' is a multi-layer printed-circuit board or other material having a laminate of insulating fiberglass layers 90, 92, 94 sandwiched between four metal layers 72, 74, 76, 78. Top metal layer 72 is on the top surface of substrate 10', while bottom metal layer 74 is on the bottom surface of substrate 10'.

Top metal layer 72 and bottom metal layer 74 are patterned to form traces for signal interconnect and bonding or soldering pads which are wide enough for soldering and bonding with the pins of DRAM chips. Interior metal layers 76, 78 are used for power and ground routing and are sometimes called the power and ground plane since these layers are often largely unpatterned sheets rather than small traces. Metal layer 76 is the power-supply layer while metal layer 78 is the ground layer.

A capacitor can be formed by forming a slug 70 of high-dielectric-constant material between the power and ground layers 76, 78. Where power metal layer 76 contacts slug 70, the top plate of the capacitor is formed, and where ground metal layer 78 contacts slug 70, the bottom plate of the capacitor is formed. Thus slug 70 forms a parallel-plate capacitor with metal layers 76, 78.

Since the capacitance value is proportional to the thickness of slug 70, a cutout in insulating layer 92 can be made for slug 70 so that slug 70 can be thinner than insulating layer 92. Metal plates in addition to metal layers 76, 78 can be fashioned directly onto slug 70 to decrease the thickness of the capacitor.

The pins of DRAM chip 20 are soldered to top metal layer 72 while DRAM chip 40 has its pins soldered to bottom metal layer 74. Via 66 is formed to electrically connect the ground pin of DRAM chip 20 to ground metal layer 78 while via 64 is formed to electrically connect the power pin of DRAM chip 20 to power metal layer 76. Likewise, via 68 is formed to electrically connect the ground pin of DRAM chip 40 to ground metal layer 78 while via 62 is formed to electrically connect the power pin of DRAM chip 40 to power metal layer 76. Thus vias 62, 64, 66, 68 provide connecting from the power and ground pins of DRAM chips 20, 40 to power and ground metal layers 76, 78 which is connected to slug 70 which forms capacitor 30".

Capacitor 30" performs decoupling for DRAM chips 20, 40 as did the surface-mounted capacitor 30 of FIGS. 2 and 4. Since DRAM chip 20 is activated by RAS0 of the first bank while DRAM chip 40 is activated by RAS1 of the second bank, only one of DRAM chips 20, 40 is actively driving data at any time. Thus a single capacitor 30" can be shared by DRAM chip 20 on the top surface and DRAM chip 40 on the bottom surface.

Many types of embedded capacitors and methods for making them are known. See U.S. Pat. Nos. 5,161,086, 4,878,155, 5,261,153, 5,172,304, RE 35,064, and U.S. Pat. No. 5,469,324 for embedded capacitors.

Other passive components may also be integrated inside the substrate. U.S. Pat. No. 4,870,746 is an example of a resistor formed on layers inside a multi-layer board. Resistors are often used to dampen ringing, or as termination. Both capacitors and resistors can be integrated inside the substrate. Integrating resistors and capacitors into the substrate layers allows the elimination of surface-mounted resistors and capacitors, thus eliminating a placement sequence, reducing cost.

Refresh

Since both banks share the RAS signal, both banks have RAS asserted at the same time, causing both banks of DRAMs to generate a current spike. However, this RAS-induced current spike is much weaker than a current spike when CAS is asserted, since CAS activates the high-current-drive data outputs during a read cycle. It is possible than both banks could be refreshed at the same time when traditional RAS-only refresh is used by a system, but most modern systems use a CAS-before-RAS refresh which can be staggered for the two banks. Refresh typically draws less current than asserting CAS so is less of a concern.

ADVANTAGES OF THE INVENTION

Capacitors are mounted on just one of the surfaces of the module, rather than on both surfaces. The invention reduces the number of placement sequences from four to three, reducing the time spent by soldering equipment, thus reducing cost. About one second per memory module is saved by placing all capacitors on one rather than two sides of the module. Since the total time on the manufacturing machine is about 10 seconds, this is a significant savings. Integrating resistors and capacitors into the substrate layers allows the elimination of surface-mounted resistors and capacitors, thus eliminating a placement sequence, reducing cost.

Capacitors can be shared among a pair of DRAM chips when the DRAM chips are both close to the shared capacitor. Sharing capacitors reduces the number of components required and the amount of time for manufacturing equipment to place the components onto the substrate. Thus sharing capacitors reduces cost as well as conserving the surface area of the module.

The pair of DRAM chips sharing a capacitor can be from different banks of DRAMs. Since only one of the banks of DRAMs is accessed at any time, only one of the DRAM chips in the pair of DRAM chips can generate a current spike requiring decoupling from the shared capacitor. Thus the invention takes advantage of the electrical configuration of a module to reduce the number of components and the cost of the module.

ALTERNATE EMBODIMENTS

Several other embodiments are contemplated by the inventors. For example the number of DRAM chips and capacitors on each side of the substrate can be varied. Wide DRAM chips of four or eight or more bit may be substituted. A single capacitor can be shared for a pair of multi-bit DRAM chips, although the value of the capacitor may need to be increased. The examples have used eight-bit-wide modules for clarity, although wider 32 and 64-bit modules are possible and preferable. Other kinds of Integrated Circuits (IC's) can be mounted, such as an address or bank decoder or a parity generator in lieu of a ninth parity bit.

Future memory modules may use memory chips other than DRAMs, or improved DRAMs such as synchronous or super-pipelined DRAMs. Some bursting DRAMs re-name the CAS signal as the chip-enable signal (CE), since they do not need a column address for all accesses. However, the chip-enable signal is considered as a type of CAS signal. Modules with three or more banks of DRAMs can share a capacitor among three or more DRAM chips, one for each bank. The memory module find its greatest application in personal computers (PC's) compatible with the IBM-AT. The terms "front surface" and "back surface" are arbitrarily assigned as shown in the Figures and each term could refer to either surface of the module in relation to the notch. Vias of through-holes provide electrical connection between the surfaces or intermediate layers. These through-holes could be filled in holes or metal traces between layers rather than open holes.

Rather than have all of one DRAM bank on one surface and all of the second DRAM bank on the other surface, some of the DRAM chips from one bank could be swapped with the DRAM chips on the opposite surface. For example, the module of FIG. 4 could be modified by swapping DRAM chips 24, 44 so that DRAM chip 24 is mounted on the back surface while DRAM chip 44 is now mounted on the front surface. The front surface then has DRAM chips 20, 22, 26 from the first bank and DRAM chip 44 from the second bank. DRAM chips 24, 44 still share capacitor 34, even though the DRAM chips have been reversed. Thus capacitors are still shared between DRAM chips from two banks, but each surface contains DRAM chips from both banks. Of course, the RAS signal has to be routed through to the opposite surface when the banks are spread over both surfaces.

Capacitors have been described as providing decoupling of current spikes from the nearest DRAM chips. This is an approximation, since all the capacitors are connected to power and ground, which are common to all DRAM chips. Thus in a strict sense, each capacitor provides decoupling for all DRAM chips in the module. However, the larger distances from a capacitor to more remote DRAM chips increases the R-C delay of the power and ground traces, delaying the decoupling of the capacitor to remote DRAM chips. Thus r emote DRAM chips are supplied current from nearby capacitors more quickly than from father-away capacitors. It is thought than most of the complementary current to cancel a current spike generated by a DRAM chip comes from the nearest capacitor to the pins of the DRAM chip.

The electrical assignment of functions or signals to pins or leads, the metal contact pads along the bottom of the module, is usually determined by an industry standard-setting committee, such as JEDEC. JEDEC specifies the order of the pins and the size of the module to allow for interchangability of modules with sockets. Redundant power and ground pins are usually assigned symmetric positions t o avoid reversing the power and ground supplies if the module is inserted backwards. DRAM chips are usually connected to a data pin as close to the chip as possible to minimize wiring lengths and delay. Current 72-pin modules are being replaced by 168-pin modules. Multi-layer printed circuit board (PCB) substrates can share the power and ground planes with signal traces to reduce the number of layers used from 6 layers to 4 layers. ASIC chips can be added to enhance the modules. A 4 Meg by 32-bit s ingle-bank, double-sided module can be constructed using 1M×16 chips. A 4M×32 double-bank, double-sided module can be constructed from 2M×8 chips. Many other configurations are possible. Modules with multiple rows of leads, such as dual-inline-memory modules (DIMMs) can also benefit from the invention. DIMMs often use dampening resistors.

The foregoing description of the embodiments of the invention has been presented for the purposes of illustration and description. It is not intended to be exhaustive or to limit the invention t o the precise form disclosed. Many modifications and variations are possible in light of the above teaching. It is intended that the scope of the invention be limited not by this detailed description, but rather by the claims appended hereto.

We claim:

1. A dual-bank memory module with shared capacitors comprising:
    a substrate having wiring traces for conducting signals, the substrate also having power-supply traces and ground traces for connection to a power supply voltage and a ground voltage;
    a plurality of leads along a bottom edge of the substrate, the plurality of leads including a power-supply lead and a ground lead and control leads and data leads, the plurality of leads for electrically connecting the dual-bank memory module to a system; and
    pairs of DRAM chips, coupled to the plurality of leads, each pair having a first DRAM chip from a first bank and a second DRAM chip from a second bank, each pair of DRAM chips sharing a capacitor coupled between power-supply and ground pins of the first and second DRAM chips;
    wherein all capacitors are mounted on a first surface of the substrate and no capacitors are mounted on a second surface of the substrate, the second surface opposite the first surface.

2. The dual-bank memory module of claim 1 wherein a number of capacitors is substantially half of a number of DRAM chips.

3. The dual-bank memory module of claim 1 wherein each pair of DRAM chips includes the first DRAM chip mounted on the first surface of the substrate and the second DRAM chip mounted on the second surface of the substrate, whereby the DRAM chips in a pair are mounted on opposite surfaces of the substrate.

4. The dual-bank memory module of claim 3 wherein the first DRAM chip is mounted opposite the second DRAM chip, the first DRAM chip on the first surface overlapping a portion of the second DRAM chip on the second surface, the substrate having an overlapping portion having the first surface with the first DRAM chip mounted thereon and the second surface with a portion of the second DRAM chip mounted thereon.

5. The dual-bank memory module of claim 4 wherein the first DRAM chip is mounted substantially opposite the second DRAM chip in each pair of DRAM chips.

6. The dual-bank memory module of claim 1 wherein the control leads include a first RAS signal and a second RAS signal, the first RAS signal connected to all DRAM chips in the first bank and not connected to any DRAM chips in the second bank, while the second RAS signal is connected to all DRAM chips in the second bank and is not connected to any DRAM chips in the first bank,
    wherein the first DRAM chip is controlled by the first RAS signal and the second DRAM chip is controlled by the second RAS signal,
    whereby the first bank and the second bank of DRAMs are separately controlled.

7. The dual-bank memory module of claim 6 wherein the first DRAM chip and the second DRAM chip in the pair of DRAM chips both are coupled to a same data bit signal in the data leads, the same data bit signal not connected to other DRAM chips in the module,
    whereby each pair of DRAM chips is coupled to a unique data bit in the data leads.

8. The dual-bank memory module of claim 7 further comprising:
    a notch and two holes in the substrate for locking the dual-bank memory module in a socket; and
    wherein the plurality of leads along the bottom edge of the substrate are arranged in an order defined as a standard by JEDEC,
    whereby the dual-bank memory module is interchangeable with other memory modules.

9. The dual-bank memory module of claim 3 further comprising:
    a through-hole in the substrate for each pair of DRAM chips, the through-hole being near the capacitor, the through-hole for connecting the capacitor to the ground pin of the first DRAM chip and to the ground pin of the second DRAM chip,
    whereby each pair of DRAM chips has a through-hole in the substrate for local connection of ground voltage to the capacitor.

10. The dual-bank memory module of claim 9 wherein the capacitor is mounted under the first DRAM chip.

11. The dual-bank memory module of claim 9 wherein the capacitor is mounted adjacent to the first DRAM chip.

12. The dual-bank memory module of claim 9 wherein the capacitor is formed inside the substrate nearer to the first DRAM chip and to the second DRAM chip than to other DRAM chips in other pairs of DRAM chips.

13. The dual-bank memory module of claim 9 wherein the substrate having wiring traces for conducting signals comprises:
    a four-layer printed circuit board (PCB), wherein the power-supply traces and the ground traces are each in a layer which also contains wiring traces for conducting signals,
    whereby cost is reduced by sharing power and ground layers with the wiring traces for conducting signals.

14. The dual-bank memory module of claim 13 wherein the plurality of leads along the bottom edge comprise a 168-pin connector.

15. The dual-bank memory module of claim 14 wherein the DRAM chips comprise synchronous DRAM chips.

16. The dual-bank memory module of claim 15 further comprising: dampening resistors mounted on the first surface of the substrate, wherein no resistors are mounted on the second surface of the substrate, the second surface opposite the first surface,
    whereby resistors are mounted on only one surface of the substrate.

17. A dual-sided, multi-bank memory module comprising:
    a substrate for making electrical connection between memory chips mounted on a first surface and on a second surface of the substrate;
    a plurality of external connecting leads on the substrate, the plurality of external connecting leads for connecting to a host system, the plurality of connecting leads including data leads and control leads;
    a plurality of shared capacitors for suppressing current spikes, the plurality of capacitors mounted on the first surface but not mounted on the second surface of the substrate;
    a first bank of memory chips for storing data, the first bank having first memory chips mounted on the substrate, the first bank driving data onto all of the data leads in response to the control leads;
    a second bank of memory chips for storing data, the second bank having second memory chips mounted on the substrate, the second bank driving data onto all of the data leads in response to the control leads;

wherein the first and the second bank drive the same data leads but are controlled by the host system to not drive data simultaneously;

the plurality of capacitors, the first bank, and the second bank being arranged on the substrate into local groups, each local group having a first memory chip from the first bank and a second memory chip from the second bank and one capacitor, the one capacitor physically located closer to the first and second memory chips in the local group than to other memory chips, whereby the one capacitor in each local group suppressing current spikes generated by the memory chips in the local group when the data in either the first bank or the second bank is accessed.

18. The dual-sided, multi-bank memory module of claim 17 wherein the first memory chip is mounted on a surface of the substrate opposite the second memory chip on a different surface of the substrate.

19. The dual-sided, multi-bank memory module of claim 18 wherein all memory chips in the first bank are mounted on the first surface and all memory chips in the second bank are mounted on the second surface.

20. The dual-sided, multi-bank memory module of claim 18 wherein the host system is a personal computer (PC).

* * * * *